US012676594B2

(12) United States Patent
Dyer et al.

(10) Patent No.: US 12,676,594 B2
(45) Date of Patent: Jul. 7, 2026

(54) TRANSVERSELY-EXCITED FILM BULK ACOUSTIC RESONATORS WITH COUNTER CHIRPED INTERDIGITAL TRANSDUCERS (IDTs) FOR MECHANICAL AND PROCESS COMPENSATION

(71) Applicant: Murata Manufacturing Co., Ltd., Nagaokakyo (JP)

(72) Inventors: Greg Dyer, Santa Barbara, CA (US); William Lu, Santa Barbara, CA (US); Douglas Jachowski, Santa Cruz, CA (US); Bryant Garcia, Burlingame, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 577 days.

(21) Appl. No.: 18/075,889

(22) Filed: Dec. 6, 2022

(65) Prior Publication Data

US 2023/0231534 A1     Jul. 20, 2023

Related U.S. Application Data

(60) Provisional application No. 63/287,927, filed on Dec. 9, 2021.

(51) Int. Cl.
H03H 9/145          (2006.01)

(52) U.S. Cl.
CPC .... H03H 9/14555 (2013.01); H03H 9/14544 (2013.01)

(58) Field of Classification Search
CPC .... H03H 9/02228; H03H 9/568; H03H 9/562; H03H 9/564; H03H 9/205; H03H 9/02;
(Continued)

(56) References Cited

U.S. PATENT DOCUMENTS 5,691,541 A * 11/1997 Ceglio ................ G03F 7/70791
378/34
5,705,399 A 1/1998 Larue
(Continued)

FOREIGN PATENT DOCUMENTS

CN         1926763 A      3/2007
CN      201893487 U      7/2011
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Andrea Lindgren Baltzell
*Assistant Examiner* — Victor Cole
(74) *Attorney, Agent, or Firm* — ArentFox Schiff LLP

(57)          ABSTRACT

An acoustic resonator has a piezoelectric plate having first and second surfaces, the second surface facing a substrate, and a diaphragm of the piezoelectric plate spanning a cavity. A conductor pattern is formed on at least one of the first and second surfaces and has an interdigital transducer (IDT) having interleaved fingers on the diaphragm portion of the piezoelectric plate. At least one of a pitch of the interleaved IDT fingers or a mark of the interleaved IDT fingers varies over an area of the IDT to compensate for process-induced distortion of the diaphragm portion of the piezoelectric plate.

12 Claims, 11 Drawing Sheets

(58) Field of Classification Search
CPC .. H03H 9/15; H03H 9/54; H03H 9/64; H03H
9/02535; H03H 9/02574; H03H 9/131;
H03H 9/132; H03H 9/171; H03H
9/02015; H03H 9/02614; H03H 9/02622;
H03H 9/02086; H03H 2003/0421; H03H
2003/0442; H03H 2003/045
USPC ........................................................ 333/187
See application file for complete search history.

(56) References Cited

U.S. PATENT DOCUMENTS

| | | | |
|---|---|---|---|
| 5,853,601 A | 12/1998 | Krishaswamy et al. | |
| 6,540,827 B1 | 4/2003 | Levy et al. | |
| 6,707,229 B1 | 3/2004 | Martin | |
| 7,135,940 B2 | 11/2006 | Kawakubo et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,802,466 B2 | 9/2010 | Whalen et al. | |
| 7,868,519 B2 | 1/2011 | Umeda | |
| 8,278,802 B1 | 10/2012 | Lee et al. | |
| 8,344,815 B2 * | 1/2013 | Yamanaka | H03H 9/643 |
| | | | 333/196 |
| 8,829,766 B2 | 9/2014 | Milyutin et al. | |
| 8,932,686 B2 | 1/2015 | Hayakawa et al. | |
| 9,130,145 B2 | 9/2015 | Martin et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,748,923 B2 | 8/2017 | Kando et al. | |
| 9,780,759 B2 | 10/2017 | Kimura et al. | |
| 10,200,013 B2 | 2/2019 | Bower et al. | |
| 10,305,447 B2 | 5/2019 | Raihn et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,826,462 B2 | 11/2020 | Plesski et al. | |
| 10,868,513 B2 | 12/2020 | Yantchev | |
| 2002/0079986 A1 | 6/2002 | Ruby et al. | |
| 2002/0158714 A1 | 10/2002 | Kaitila et al. | |
| 2003/0199105 A1 | 10/2003 | Kub et al. | |
| 2004/0041496 A1 | 3/2004 | Imai et al. | |
| 2004/0090145 A1 | 5/2004 | Bauer et al. | |
| 2004/0207033 A1 | 10/2004 | Koshido | |
| 2004/0207485 A1 | 10/2004 | Kawachi et al. | |
| 2004/0261250 A1 | 12/2004 | Kadota et al. | |
| 2005/0280476 A1 | 12/2005 | Abe et al. | |
| 2006/0072875 A1 | 4/2006 | Bhagavatula et al. | |
| 2006/0125489 A1 | 6/2006 | Feucht et al. | |
| 2006/0131731 A1 | 6/2006 | Sato | |
| 2006/0152107 A1 | 7/2006 | Tanaka | |
| 2006/0222568 A1 | 10/2006 | Wang et al. | |
| 2007/0001549 A1 | 1/2007 | Kando et al. | |
| 2007/0090898 A1 | 4/2007 | Kando | |
| 2007/0170565 A1 | 7/2007 | Hong et al. | |
| 2007/0188047 A1 | 8/2007 | Tanaka | |
| 2007/0194863 A1 | 8/2007 | Shibata et al. | |
| 2010/0064492 A1 | 3/2010 | Tanaka | |
| 2010/0102669 A1 | 4/2010 | Yamanaka | |
| 2010/0107388 A1 | 5/2010 | Iwamoto | |
| 2010/0123367 A1 | 5/2010 | Tai et al. | |
| 2010/0212127 A1 | 8/2010 | Heinze et al. | |
| 2010/0223999 A1 | 9/2010 | Onoe | |
| 2010/0301703 A1 | 12/2010 | Chen et al. | |
| 2011/0109196 A1 | 5/2011 | Goto | |
| 2011/0199163 A1 | 8/2011 | Yamanaka | |
| 2011/0278993 A1 | 11/2011 | Iwamoto | |
| 2013/0015353 A1 | 1/2013 | Tai et al. | |
| 2013/0021116 A1 | 1/2013 | Sogoya et al. | |

| | | | |
|---|---|---|---|
| 2013/0057360 A1 | 3/2013 | Meltaus et al. | |
| 2013/0321100 A1 | 12/2013 | Wang | |
| 2014/0001919 A1 | 1/2014 | Komatsu | |
| 2014/0009032 A1 | 1/2014 | Takahashi et al. | |
| 2014/0113571 A1 | 4/2014 | Fujiwara | |
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0218129 A1 | 8/2014 | Fujiwara | |
| 2014/0225684 A1 | 8/2014 | Kando et al. | |
| 2014/0312994 A1 | 10/2014 | Meltaus et al. | |
| 2015/0070227 A1 | 3/2015 | Kishino et al. | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0049920 A1 | 2/2016 | Kishino | |
| 2016/0182009 A1 | 6/2016 | Bhattacharjee | |
| 2016/0285430 A1 | 9/2016 | Kikuchi et al. | |
| 2017/0005638 A1 | 1/2017 | Otagawa et al. | |
| 2017/0063332 A1 | 3/2017 | Gilbert et al. | |
| 2017/0077902 A1 | 3/2017 | Daimon | |
| 2017/0104470 A1 | 4/2017 | Koelle et al. | |
| 2017/0170808 A1 | 6/2017 | Iwaki et al. | |
| 2017/0179928 A1 | 6/2017 | Raihn et al. | |
| 2017/0187352 A1 | 6/2017 | Omura | |
| 2017/0214387 A1 | 7/2017 | Burak et al. | |
| 2017/0222618 A1 | 8/2017 | Inoue et al. | |
| 2017/0222622 A1 | 8/2017 | Solal et al. | |
| 2017/0264263 A1 | 9/2017 | Huang et al. | |
| 2017/0324394 A1 | 11/2017 | Ebner et al. | |
| 2017/0359050 A1 | 12/2017 | Irieda et al. | |
| 2017/0370791 A1 | 12/2017 | Nakamura et al. | |
| 2018/0062604 A1 | 3/2018 | Koskela et al. | |
| 2018/0123016 A1 | 5/2018 | Gong et al. | |
| 2018/0152169 A1 | 5/2018 | Goto et al. | |
| 2018/0191322 A1 | 7/2018 | Chang et al. | |
| 2019/0068164 A1 | 2/2019 | Houlden et al. | |
| 2019/0123721 A1 | 4/2019 | Takamine | |
| 2019/0131953 A1 | 5/2019 | Gong | |
| 2019/0148621 A1 | 5/2019 | Feldman et al. | |
| 2019/0181833 A1 | 6/2019 | Nosaka | |
| 2019/0245518 A1 | 8/2019 | Ito | |
| 2019/0273480 A1 | 9/2019 | Lin | |
| 2019/0273481 A1 | 9/2019 | Michigami | |
| 2019/0386635 A1 | 12/2019 | Plesski et al. | |
| 2019/0386637 A1 | 12/2019 | Plesski et al. | |
| 2019/0386638 A1 | 12/2019 | Kimura et al. | |
| 2020/0007110 A1 | 1/2020 | Konaka et al. | |
| 2020/0021271 A1 | 1/2020 | Plesski et al. | |
| 2020/0091893 A1 | 3/2020 | Plesski et al. | |
| 2020/0162052 A1 | 5/2020 | Matsuoka et al. | |
| 2020/0220522 A1 | 7/2020 | Nosaka | |
| 2020/0228087 A1 | 7/2020 | Michigami et al. | |
| 2020/0304091 A1 | 9/2020 | Yantchev | |
| 2020/0328728 A1 | 10/2020 | Nakagawa et al. | |
| 2020/0336130 A1 | 10/2020 | Turner | |
| 2020/0373907 A1 | 11/2020 | Garcia | |
| 2021/0006228 A1 | 1/2021 | Garcia | |
| 2021/0013859 A1 | 1/2021 | Turner et al. | |
| 2021/0013868 A1 | 1/2021 | Plesski | |
| 2021/0067138 A1 * | 3/2021 | Yantchev | H03H 9/14582 |
| 2021/0126619 A1 | 4/2021 | Wang et al. | |
| 2021/0273631 A1 | 9/2021 | Jachowski et al. | |
| 2021/0384885 A1 | 12/2021 | Daimon et al. | |
| 2022/0103160 A1 | 3/2022 | Jachowski | |
| 2022/0216842 A1 | 7/2022 | Nagatomo et al. | |
| 2022/0231661 A1 | 7/2022 | McHugh | |

FOREIGN PATENT DOCUMENTS

| | | | |
|---|---|---|---|
| CN | 112352382 A | 2/2021 | |
| DE | 112011100580 T5 | 1/2013 | |
| JP | H0522074 A | 1/1993 | |
| JP | H10209804 A | 8/1998 | |
| JP | 2001244785 A | 9/2001 | |
| JP | 2002300003 A | 10/2002 | |
| JP | 2003078389 A | 3/2003 | |
| JP | 2004096677 A | 3/2004 | |

(56) References Cited

FOREIGN PATENT DOCUMENTS

| | | | |
|---|---|---|---|
| JP | 2004129222 A | 4/2004 | |
| JP | 2004304622 A | 10/2004 | |
| JP | 2006173557 A | 6/2006 | |
| JP | 2007251910 A | 9/2007 | |
| JP | 2010103803 A | 5/2010 | |
| JP | 2010109949 A | 5/2010 | |
| JP | 2010233210 A | 10/2010 | |
| JP | 2013528996 A | 7/2013 | |
| JP | 2015054986 A | 3/2015 | |
| JP | 2016001923 A | 1/2016 | |
| JP | 2017220910 A | 12/2017 | |
| JP | 2018166259 A | 10/2018 | |
| JP | 2018207144 A | 12/2018 | |
| JP | 2019186655 A | 10/2019 | |
| JP | 2020088459 A | 6/2020 | |
| JP | 2020113939 A | 7/2020 | |
| WO | 2010047114 A1 | 4/2010 | |
| WO | 2013021948 A1 | 2/2013 | |
| WO | 2015098694 A1 | 7/2015 | |
| WO | 2015156232 A1 | 10/2015 | |
| WO | 2015182521 A1 | 12/2015 | |
| WO | 2016017104 A1 | 2/2016 | |
| WO | 2016052129 A1 | 4/2016 | |
| WO | 2016147687 A1 | 9/2016 | |
| WO | 2018003273 A1 | 1/2018 | |
| WO | 2018079522 A1 | 5/2018 | |
| WO | 2018163860 A1 | 9/2018 | |
| WO | 2019138810 A1 | 7/2019 | |
| WO | 2019241174 A1 | 12/2019 | |
| WO | 2020092414 A2 | 5/2020 | |
| WO | 2020175234 A1 | 9/2020 | |
| WO | 2021060523 A1 | 4/2021 | |
| WO | 2023002858 A1 | 1/2023 | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHz Lithium Niobate Mems Resonators With High Fom Of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary "Meaning of diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

"Acoustic Properties of Solids" ONDA Corporation, 592 Weddell Drive, Sunnyvale, CA 94089, Apr. 11, 2003, pp. 5 (Year 2003).

Bahreynl, B., "Fabrication and Design of Resonant Microdevices" Andrew William, Inc. 2018, NY (Year 2008).

Material Properties of Tibtech Innovations, © 2018 TIBTECH Innovations (Year 2018).

Bousquet, Marie e al. "Single-mode high frequency LiNbO3 Film Bulk Acoustic Resonator," 2019 IEEE International Ultrasonics Symposium (IUS), Glasgow, Scotland, Oct. 6-9, 2019, pp. 84-87.

Wikipedia contributors, "Quartz crystal microbalance," Wikipedia, The Free Encyclopedia, https://en.wikipedia.org/w/index.php?title=Quartz_crystal_microbalance&oldid=1009990186 (accessed Apr. 9, 2021).

Yantchev, Ventsislav & Katardjiev, Ilia. (2013). Thin film Lamb wave resonators in frequency control and sensing applications: A review. Journal of Micromechanics and Microengineering. 23. 043001. 10.1088/0960-1317/23/4/043001.

Wei Pang et al. "Analytical and experimental study on the second harmonic mode response of a bulk acoustic wave resonator" 2010 J. Micromech. Microeng. 20 115015; doi:10.1088/0960-1317/20/11/115015.

Durmus et al. "Acoustic-Based Biosensors" Encyclopedia of Microfluidics and Nanofluidics. DOI 10.1007/978-3-642-27758-0_10-2 Springer Science+Business Media New York 2014.

USPTO/ISA, International Search Report and Written Opinion for PCT Application No. PCT/US2023/017732 dated Jul. 27, 2023.

USPTO/ISA, International Search Report and Written Opinion for PCT Application No. PCT/US2022/082421 dated May 3, 2023.

USPTO/ISA, International Search Report and Written Opinion for PCT Application No. PCT/US2022/081095 dated May 30, 2023.

USPTO/ISA, International Search Report and Written Opinion for PCT Application No. PCT/US2022/079236 dated Mar. 10, 2023.

USPTO/ISA, International Search Report and Written Opinion for PCT Application No. PCT/US2022/081068 dated Apr. 18, 2023.

USPTO/ISA, International Search Report and Written Opinion for PCT Application No. PCT/US2022/080246 dated Mar. 30, 2023.

Gong et al., "Design and Analysis of Lithium-Niobate-Based High Electromechanical Coupling RF-MEMS Resonators for Wideband Filtering", IEEE Transactions on Microwave Theory and Techniques, vol. 61, No. 1, Jan. 2013, pp. 403-413.

* cited by examiner

DETAIL C

SECTION A-A $$p_i = \sqrt{p^2 + h_i^2}$$

$$p'_i = \sqrt{p'^2 - h_i^2}$$

Note: only one of actions 610A, 610B, 610C is performed in each of three variations of the process 600.

TRANSVERSELY-EXCITED FILM BULK ACOUSTIC RESONATORS WITH COUNTER CHIRPED INTERDIGITAL TRANSDUCERS (IDTs) FOR MECHANICAL AND PROCESS COMPENSATION

CROSS REFERENCE TO RELATED APPLICATIONS

This patent claims priority to co-pending U.S. provisional patent application No. 63/287,927, filed Dec. 9, 2021, entitled COUNTER CHIRPED XBAR RESONATORS FOR MECHANICAL AND PROCESS COMPENSATION.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of or having a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Figure 1:
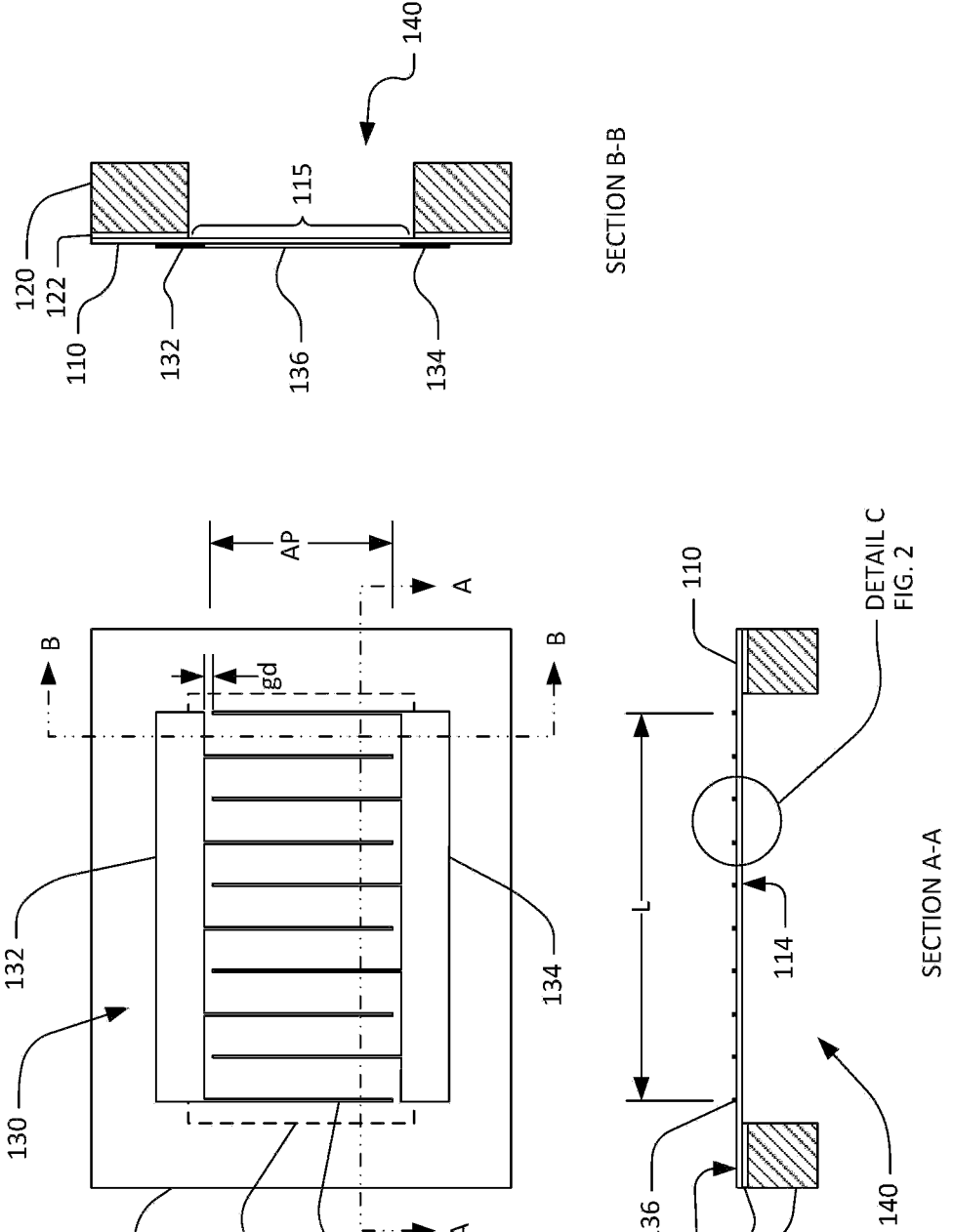
FIG. 1 includes a schematic plan view and two schematic cross-sectional views of a transversely-excited film bulk acoustic resonator (XBAR).

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUS-TIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

In this context, the coupling may be the frequency separation between resonance and anti-resonance for a resonator. This may be directly proportional to the "electromechanical coupling", which is the ratio of mechanical energy (e.g., energy put into the resonator A1 mode for an A1 mode resonator) versus electrical input energy. In this sense, it is how well the input electrical energy "couples" into the mechanical A1 XBAR mode trying to be excited.

A piezoelectric membrane may be a part of a plate of single-crystal piezoelectric material that spans a cavity in the substrate. A piezoelectric diaphragm may be the membrane and may include front-side and/or back-side dielectric layers. An XBAR resonator may be such a diaphragm or membrane with an IDT formed on a diaphragm or membrane.

The diaphragm of an XBAR may distort or bow due to stress that accumulates during the processes used to fabricate the resonator as well as stress due to temperature change during operation or use. In either case, the distortion of the diaphragm will cause corresponding distortion of the IDT, including changes in the pitch and width of the interleaved IDT fingers. Since the distortion due to process stress is somewhat predictable, distortion of the IDT may be compensated by pre-distorting the IDT such as by counter chirping the IDTs for mechanical and process compensation of the distortion due to process stress.

The following describes improved XBAR resonators, filters and fabrication techniques for XBAR resonators with counter chirped IDTs for mechanical and process compensation of diaphragm distortion or bowing due to process stress. The pitch of the interleaved IDT fingers in the length (dimension L) direction of the XBAR and/or a mark (e.g., linewidth) of the interleaved IDT fingers in the aperture (dimension AP) direction of the XBAR can be varied over an area of the IDT, such as the aperture or diaphragm, to compensate for process-induced distortion of the diaphragm.

Counter chirping the IDT may include counter chirping or pre-chirping the finger pitches and/or marks of adjacent fingers to have different pitches and/or marks on the plate at one processing step so the adjacent fingers will have a constant pitch and/or mark after a later processing step causes the distortion in the length (dimension L) direction and/or in the aperture (dimension AP) direction of the XBAR due to process stress. Counter chirping the IDT provides mechanical and process compensation of the distortion due to later process stress, such as caused by forming the cavity, etching the cavity and/or releasing the diaphragm.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The front and back surfaces 112 and 114 can also more generally be considered as first and second surfaces. Moreover, the piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. The piezoelectric plate may be Y-cut (which is to say the Y axis is normal to the front and back surfaces 112, 114), rotated Y-cut. XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide (BOX) layer or an intermediate layer 122, such as a layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous" means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT. As shown in FIG. 1, the IDT 130 can be formed on the upper surface 112 (i.e., the first surface of plate 110) that faces away from cavity 140, as described below. However, in an alternative aspect, the IDT 130 can be disposed on the bottom surface 114 (i.e., the second surface of the plate 110) that directly faces cavity 110. Thus, the exemplary configurations of IDT 130 can be applied to either surface (or both surfaces) of the piezoelectric plate 110 according to exemplary aspects.

There are gap distances gd from the tip of the IDT finger ends to the nearest surface of the opposing busbar. Distances gd can be in a range of between 1 and 10 um. The gap distances gd may be in a direction tangential to the tip of the finger end. The gap distances gd may be between 1 and 5 um. It may be between 2 and 4 um. It may be 3 um. The gap distance gd may be the pitch p minus the mark m or width of the fingers.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
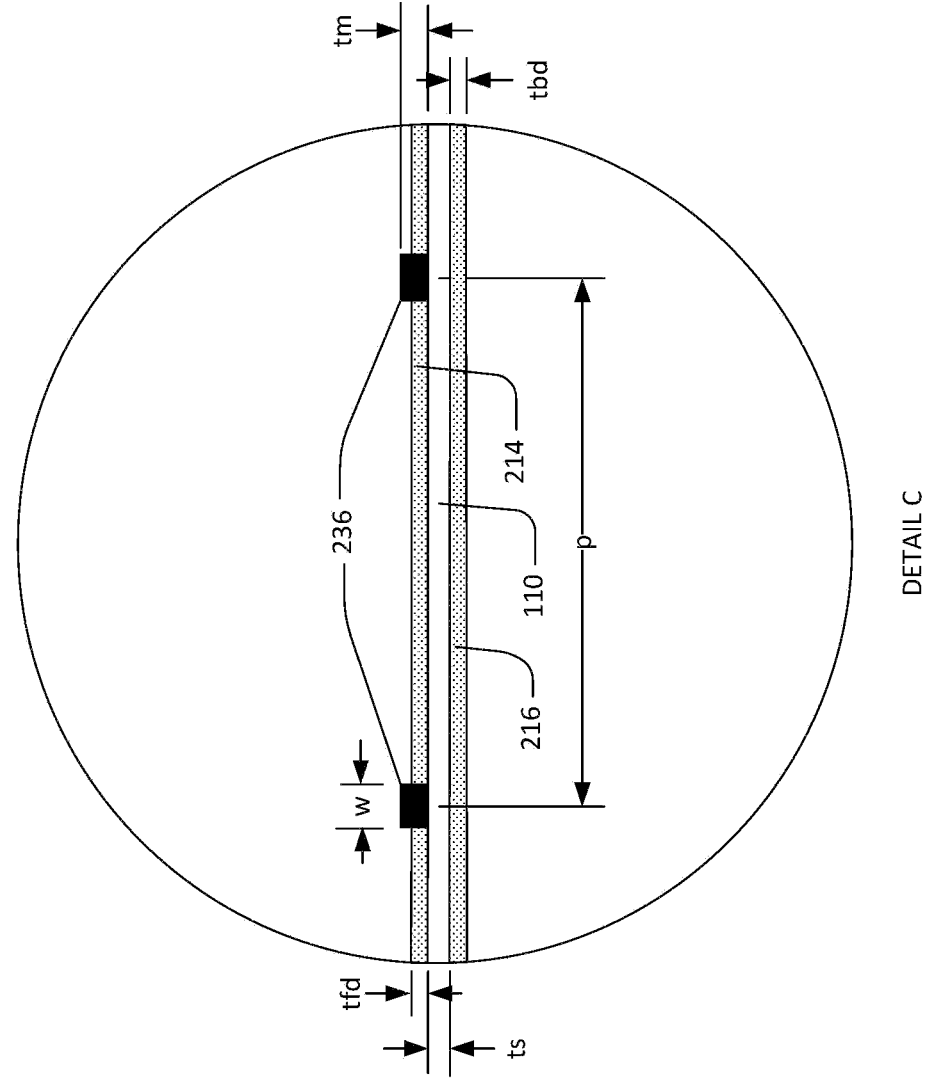
FIG. 2 is an expanded schematic cross-sectional view of a portion of the XBAR of FIG. 1.
Figure 2:

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

The plate 110 may be Z-cut LN, 82-Y cut LN, 120-Y cut LN or 128-Y cut LN. In some cases, the plate 110 may be cut in a range between 82-Y cut to Z-cut; or between 110-Y and 157-Y cut. It may have a thickness ts of between 70 nm and 500 nm. It may have a thickness ts of between 350 nm and 450 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 236. Although not shown in FIG. 2, the front side dielectric layer 214 may also be deposited over the IDT fingers 236. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness is of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuity external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 236 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. When the center-to-center spacing of the IDT fingers varies along the length of the IDT, the "pitch" is the average of the center-to-center spacings of all pairs of adjacent fingers. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The pitch p may be between 3 um and 8 um. The pitch p may be between 4 um and 5 um. The plate thickness ts may be between 300 nm and 500 nm. The plate thickness ts may be 400 nm. The finger width w may be between 0.5 um and 7.5 um. The finger width w may be 1 um. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
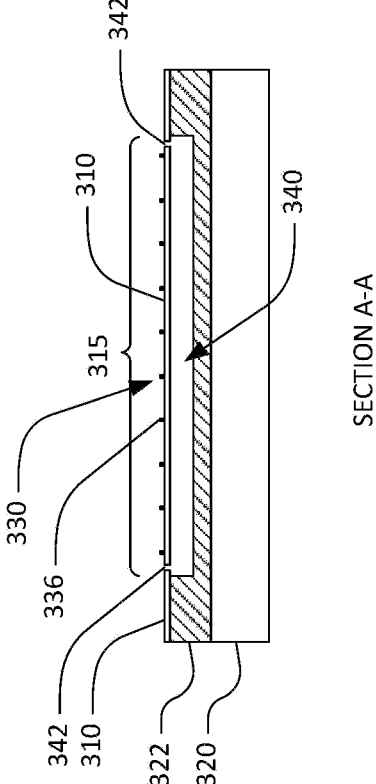
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to an intermediate layer 322 of a substrate 320. A portion of the piezoelectric plate 310 forms a diaphragm 315 spanning a cavity 340 in the substrate. The cavity 340, does not fully penetrate the intermediate layer 322, and is formed in the layer 322 under the portion of the piezoelectric plate 310 containing the IDT 330 of a conductor pattern (e.g., first metal or M1 layer) of an XBAR. Fingers, such as finger 336, of an IDT are disposed on the diaphragm 315. Interconnection of the IDT (e.g., busbars) 330 to signal and ground paths may be through a second conductor pattern (e.g., M2 metal layer, not shown in FIGS. 1-3A) to other conductor patterns and/or to electrical contacts on a package.

Plate 310, diaphragm 315 and fingers 336 may be plate 110, diaphragm 115 and fingers 136 (or 236). The cavity 340 may be formed, for example, by etching the layer 322 before attaching the piezoelectric plate 310. Alternatively, the cavity 340 may be formed by etching the layer 322 with a selective etchant that reaches the layer 322 through one or more holes or openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

Intermediate layer 322 may be one or more intermediate material layers attached between plate 310 and substrate 320. An intermediary layer may be or include a bonding layer, a BOX layer, an etch stop layer, a sealing layer, an adhesive layer or layer of other material that is attached or bonded to plate 310 and substrate 320. A layer of layers 322 may be a dielectric, an oxide, a silicon oxide, silicon nitride, an aluminum oxide, silicon dioxide or silicon nitride. Layers 322 may be one or more of any of these layers or a combination of these layers.

While the cavity 340 is shown in cross-section, it should be understood that the lateral extent of the cavity is a continuous closed band area of layer 322 that surrounds and defines the size of the cavity 340 in the direction normal to the plane of the drawing. The lateral (i.e. left-right as shown in the figure) extent of the cavity 340 is defined by the lateral edges layer 322. The vertical (i.e. down from plate 310 as shown in the figure) extent or depth of the cavity 340 into layer 322. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the layer 322 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

In some cases, layer 322 does not exist and the plate is bonded directly to the substrate 320; and the cavity is formed in and etched into the substrate 320.

In some cases, although not shown in the figure, layer 322 is a thinner layer than the depth of the cavity such that the plate is bonded directly to layer 322; and the cavity is formed in and etched into the layer 322 and into the substrate 320. Here, the cavity extends completely through layer 322 and has a cavity bottom in the substrate 320.

Figure 3B:
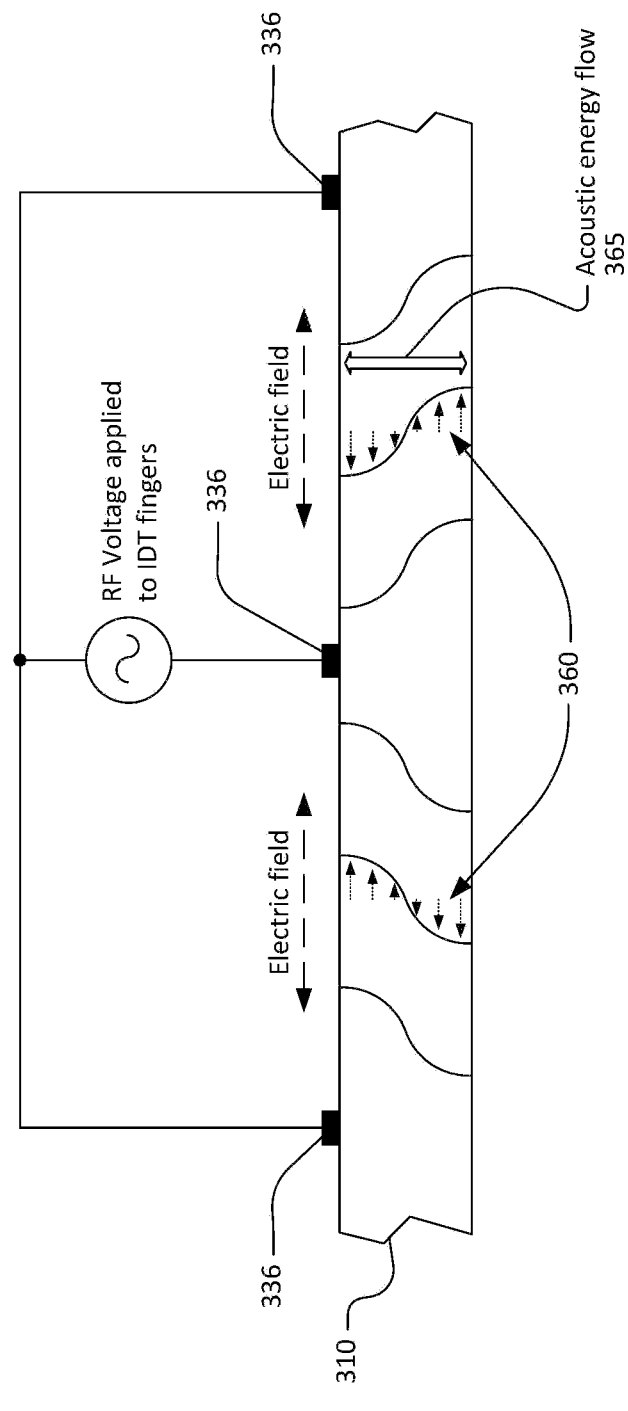
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figures 4A, 4B:
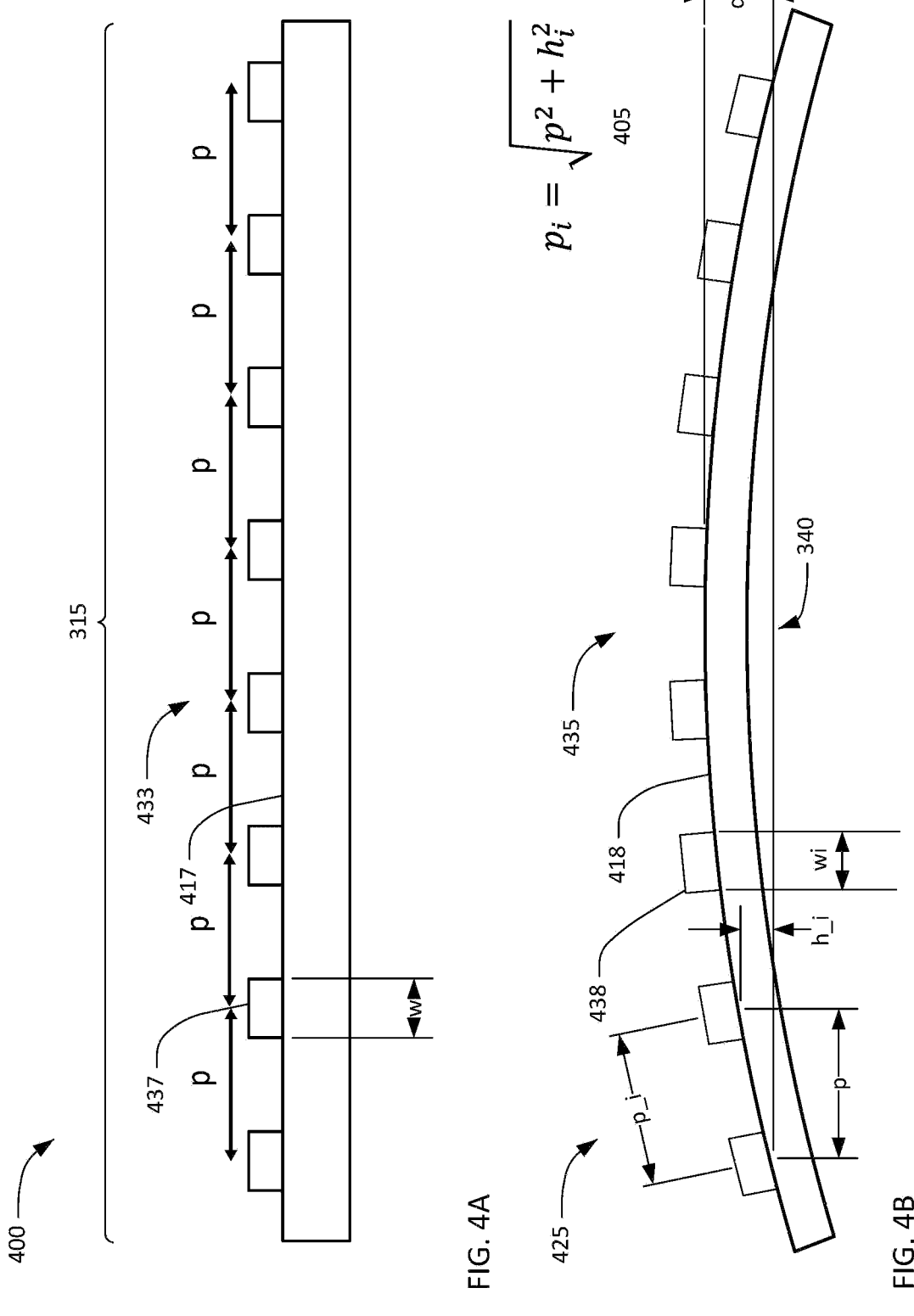
FIG. 4A shows a simplified schematic cross-sectional side view of an XBAR without counter chirped interdigital transducers (IDTs) for mechanical and process compensation.
FIG. 4B shows a simplified schematic cross-sectional side view of the XBAR of FIG. 4A after forming a cavity or during use.

FIG. 4A shows a simplified schematic cross-sectional side view of an XBAR 400 without a counter chirped interdigital transducers (IDTs) for mechanical and process compensation. FIGS. 4A-4D show a view with respect to section A-A of FIG. 1 or 3. Device 400 may represent a version of device 100, 300 and/or 350 without a counter chirped IDT 433. Device 400 is shown with a constant pitch p of the interleaved IDT fingers 437 in the length (dimension L) direction of the XBAR and a constant mark w of the interleaved IDT fingers 437 in the aperture (dimension AP) direction of the XBAR that does not vary over an area of the IDT to compensate for process-induced distortion of the diaphragm portion of the piezoelectric plate 417. FIG. 4A shows all or part of all of the diaphragm portion, such as by showing only a portion or all of diaphragm 315.

XBAR 400 may be a version of an XBAR prior to a process-induced distortion of the diaphragm portion of plate 417 from a mechanical displacement and/or a stress that varies along the direction tangential to a length of the fingers, or in the direction of width w and pitch p. XBAR 400 may be a version of an XBAR prior to mechanical or process-driven spatial variations of plate 417 due to the forming the cavity 340; or prior to compensating for temperature variations in the plate after forming the cavity 340, such as during use of the XBAR in filter.

FIG. 4B shows a simplified schematic cross-sectional side view of an XBAR 425 which is the XBAR 400 after forming a cavity 340 or during use and without mechanical and process compensation. Device 425 is shown with a varied pitch p_i of the interleaved IDT fingers 438 and/or a varied mark wi of the interleaved IDT fingers 438 that vary over an area of the IDT 435 because the constant pitch p and constant mark w of FIG. 4A does not compensate for process-induced distortion of the diaphragm portion of the piezoelectric plate 418.

The pitch p_i and the mark wi vary in XBAR 425 due to the distortion of the diaphragm of plate 418 as compared to that of plate 417, as shown by increase in height dd as of plate 418 as compared to that of plate 417 prior to process-induced distortion of the diaphragm portion. In some cases, only one of the pitch or mark vary in XBAR 425 as compared to XBAR 400.

XBAR 425 may be a version of an XBAR 400 after a process-induced distortion dd of the diaphragm portion of plate 418 from a mechanical displacement and/or a stress that varies along the direction tangential to a length of the fingers, or in the direction of width wi and pitch p_i. XBAR 425 may be a version of an XBAR 400 after mechanical or process-driven spatial variations dd of plate 418 due to the forming the cavity 340; or compensating for temperature variations in the plate 418 after forming the cavity 340, such as during use of the XBAR 425 in filter.

As shown by equation 405 of FIG. 4B, the pitch (and the mark) of the IDT of XBAR 425 may vary along the direction of the pitch and mark (e.g., perpendicular to the finger length) according to $p_i = (p^2 + h_i^2)^{1/2}$, where i is an integer representing a pitch between adjacent fingers or a mark of a finger, $p_i$ is the pitch or mark variation for the finger, p is a length along the direction of the process-induced distortion for the pitch or finger, and h is a height of the process-induced distortion for the pitch or finger. The sum of all $h_i$'s across the diaphragm may be equal to the distance of variations dd.

XBAR 425 may be an example of mechanically induced IDT chirping. For example, XBAR 400 may be a synchronous resonator on a flat substrate, such as an unreleased piezoelectric platelet or plate not having a cavity 340 below it, which will have a uniform pitch. However, the released membrane of XBAR 425 (e.g., after forming a cavity 340) will have a deflection curvature that slightly perturbs the pitch of each electrode, inducing a gradient in acoustic wavevector, or simply a chirp in pitch and possibly in mark. Residual stress that perturbs the membrane stiffness will have a similar effect in terms of inducing a gradient in acoustic velocity, or a chirp in acoustic velocity. The induced gradient from releasing the membrane and/or residual stress may be variation dd or the sum of $h_i$'s.

Consequently, XBAR membranes are known to have mechanical displacements and stresses that vary by position over the length of a resonator or membrane. Additionally, processing may also introduce variations with systematic dimensional gradients. These artifacts induce a 'process bias' that emulates the effects of IDT chirping in the released membrane or during use. FIGS. 4A and 4B show an example of this variation as variation dd or the sum of $h_i$'s; and this chirping as pitches p_i and marks wi.

However, if this emulated effect of IDT chirping is not desired, IDT pitch 'counter chirping' can be used to compensate for these mechanical and process-driven spatial variations and chirping. When a physical mechanism such as membrane deflection induces an IDT chirp with a spatial distribution, the resonator may be drawn in its computer aided design (CAD) layout and/or designed with an equal in magnitude and opposite polarity chirp, or pre-chirped to compensate. The counter chirping may compensate for the chirped pitches p_i and marks wi give the known variation dd or sum of $h_i$'s. This effectively extends "process bias" from a spatially uniform correction to a bias correction with spatial gradient(s). The process bias is a small dimensional change on a CAD layout to drawn patterns that produces in the as-built dimensions of a fabricated micro-structure or nano-structure the optimal, or intended, dimensions. Optical lithography and etching, for example, can both produce micro-structure or nano-structures that vary from CAD dimensions on a mask reticle. For IDTs on a flat surface with uniform piezoelectric properties, a process-induced offset, or process bias, for drawing dimensions in a CAD layout would require a constant process bias for all pitch and mark dimensions. According to an exemplary aspect, a process bias is used that depends on the location of an IDT on a diaphragm, due to the diaphragm having some curvature or other non-uniformity that is predictable from the position of an IDT on the diaphragm.

Figures 4C, 4D:
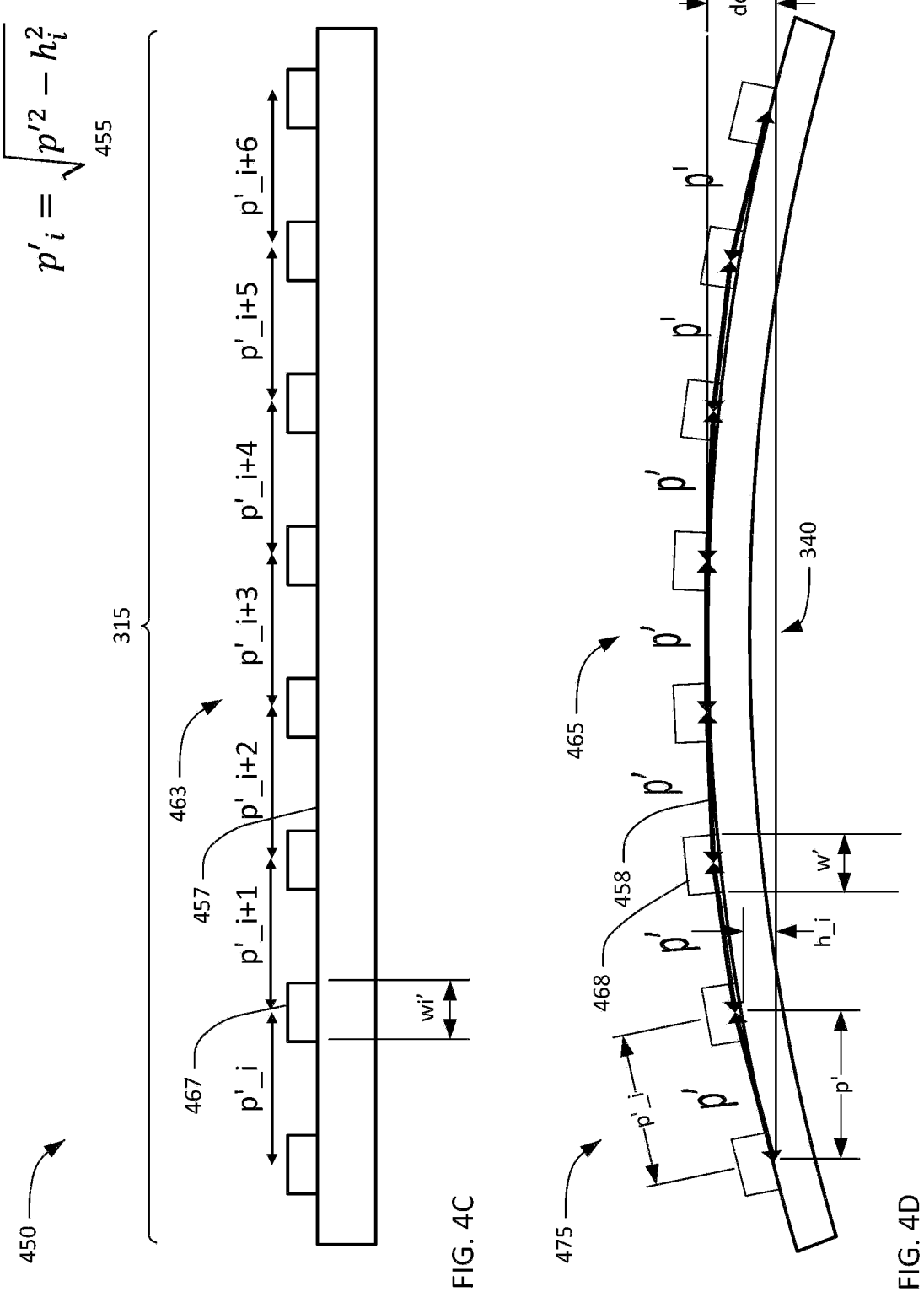
FIG. 4C shows a simplified schematic cross-sectional side view of an XBAR with counter chirped IDTs for mechanical and process compensation.
FIG. 4D shows a simplified schematic cross-sectional side view of the XBAR of FIG. 4D after forming a cavity or during use.

FIG. 4C shows a simplified schematic cross-sectional side view of an XBAR 450 with counter chirped interdigital transducers (IDTs) for mechanical and process compensation. Device 450 may represent a version of device 100, 300 and/or 350 with a counter chirped IDT. Device 450 is shown with a varying pitch p'_i-p'_i+6 of the interleaved IDT fingers 467 in the length (dimension L) direction of the XBAR and/or a varying mark wi' of the interleaved IDT fingers 467 in the aperture (dimension AP) direction of the XBAR that vary over an area of the IDT 463 to compensate for process-induced distortion of the diaphragm portion of the piezoelectric plate 457. The varying pitches p'_i-p'_i+6 and/or marks wi of the interleaved IDT fingers 467 may be a counter chirping or pre-chirping the IDT 463. Fingers 467 and pitches p'_i-p'_i+6 may represent a portion of the IDT fingers and pitches. There may be fewer or more than the 8 fingers shown. In some cases, there may be dozens or hundreds of fingers. FIG. 4C shows all or part of all of the diaphragm portion, such as by showing only a portion or all of diaphragm 315.

XBAR 450 may be a version of an XBAR prior to a process-induced distortion of the diaphragm portion of plate 457 from a mechanical displacement and/or a stress that varies along the direction tangential to a length of the fingers, or in the direction of marks wi and pitches p'_i-p'_i+6. XBAR 450 may be a version of an XBAR prior to mechanical or process-driven spatial variations dd of plate 458 due to the forming the cavity 340; or compensating for temperature variations in the plate 458 after forming the cavity 340, such as during use of the XBAR in filter.

FIG. 4D shows a simplified schematic cross-sectional side view of an XBAR 475 which is the XBAR 450 after forming a cavity 340 or during use and with mechanical and process compensation. Device 475 is shown with a constant pitch p' of the interleaved IDT fingers 468 and a constant mark w' of the interleaved IDT fingers 468 that do not vary over an area of the IDT 465 because the varying counter pitches p'_i-p'_i+6 and/or marks wi of FIG. 4C compensate for process-induced distortion of the diaphragm portion of the piezo-electric plate 458.

The varying counter pitches and/or marks of XBAR 450 prior to process-induced distortion of the diaphragm portion cause pitch p' and mark w' to be constant in XBAR 475 due to the distortion of the diaphragm of plate 458 as compared to that of plate 457, as shown by increase in height dd as of plate 458 as compared to that of plate 457. In some cases, only one of the pitch or mark vary in XBAR 475 as compared to XBAR 450. In other cases, they both vary. For instance, FIGS. 4A and 4C may show XBARS with unreleased (flat) platelets or plates; while FIGS. 4B and 4D may show XBARS with released (curved) platelets or plates.

XBAR 475 may be a version of an XBAR 450 after a process-induced distortion dd of the diaphragm portion of plate 458 from a mechanical displacement and/or a stress that varies along the direction tangential to a length of the fingers, or in the direction of width w' and pitch p'. XBAR 475 may be a version of an XBAR 450 after mechanical or process-driven spatial variations dd of plate 458 due to the forming the cavity 340; or compensating for temperature variations in the plate 458 after forming the cavity 340, such as during use of the XBAR 475 in filter.

As shown by equation 455 of FIG. 4C, the pitch p' (and/or the mark w') of the IDT of XBAR 475 may be counter chirped to vary along the direction of the pitch and mark according to $p'_i = (p'^2 - h_i^2)^{1/2}$, where i is an integer representing a pitch between adjacent fingers or a mark of a finger, $p'_i$ is the counter pitch or mark variation for the finger, p' is a length along the direction of the process-induced distortion for the pitch or finger, and h is a height of the process-induced distortion for the pitch or finger. The sum of all $h_i$'s across the diaphragm may be equal to the distance of variations dd.

Consequently, once the physical effect of the membrane deflection or variation dd, possibly including stress gradient, can be defined, such as noted for XBAR 425, then a 'counter chirp' may be designed such as noted for XBAR 450. A resonator CAD layout, and thus IDTs on unreleased membrane of XBAR 450, will have a counter chirp, that compensates for the chirped pitches p_i and marks wi of XBAR 425 given the known variation dd or sum of hi's. Then, upon membrane release by forming of the cavity 340 of XBAR 475, the designed counter chirp from XBAR 450 and the induced chirp noted for XBAR 425 will counter or cancel each other so that there is constant pitch p and constant mark w across the diaphragm of XBAR 475.

FIGS. 4C and 4D show resonators 450 and 475 having piezoelectric plates 457 and 458 with parallel front and back surfaces. The back surface of the plate faces a substrate (not shown) and may be bonded to an intermediary layer of the substrate except for a portion of the piezoelectric plate 458 forming a diaphragm portion spanning a cavity 340 in the intermediary layer. The diaphragm portion may be a portion of diaphragm 315 and the cavity may be a cavity as shown in FIG. 1 or 3A. At least one of a pitch p'_i of the interleaved IDT fingers 467 or a mark wi' of the interleaved IDT fingers 467 varies over an area of the IDT 463 to compensate for process-induced distortion of the diaphragm portion of the piezoelectric plate. The varying pitch and mark of the interleaved IDT fingers 467 may be counter chirping over a diaphragm 315 of the IDT 463 to compensate for process-induced distortion of the diaphragm portion of the piezoelectric plate 458 during or after forming the cavity 340.

The pitch and the mark may vary over the diaphragm portion to compensate for bowing of the diaphragm portion due to process stress during fabrication of the XBAR 475 and/or temperature changes during use of XBAR 475. In some cases, bowing due to process stress or temperature changes during use occurs when the plate temperature increases causing the plate to have a concave curvature of plate 475, such as a curve that is hollow and curved like the inside of a bowl from the perspective of the cavity 340 or substrate. The concave shape may also be a bottom surface of the plate 475 which part of is a straight line with a central part that is concave by having a "dent" or upward indentation in it where the internal angle is greater than 5°.

The pitch and the mark vary over the diaphragm portion by pre-chirping pitches p'i and marks wi' of pairs of adjacent fingers 467 of the IDT 463 to have different pitches and marks on the plate 457 prior to forming the cavity 340 so that the pairs of adjacent fingers 468 have constant pitches p' and marks w' after forming the cavity 340. Pitches p'i of the interleaved IDT fingers 467 vary over an area of the IDT 463 to compensate for process-induced distortion of the diaphragm portion of the piezoelectric plate 457 when it becomes plate 458.

An overlapping distance of the interleaved fingers 467 and 468 defines an aperture AP of the devices 450 and 475. At any point along a length of the IDT 463, the at least one of the pitch or the mark of that IDT varies across the aperture AP of the IDT. The pitch and the mark of IDT 463 may both vary along the aperture AP and the mark varies along the diaphragm since the mark exists even where pitch does not in gaps between the ends of one set of fingers and opposing busbars.

At least one of the pitch p'i or the mark wi' of the IDT 463 varies across all of the plurality of fingers in a direction, such as along the direction shown for diaphragm 315. At least one of the pitch p'i of the interleaved and the mark wi' (e.g., a linewidth of the fingers) of the IDT 463 varies in the direction which may be tangential to a length of the fingers, and/or in the direction of the pitch and mark.

The process-induced distortion of the diaphragm portion may be a mechanical displacement and/or a stress that varies along the direction. XBARS are known to have mechanical displacements and stresses that vary by positions over the direction of the resonator. Thus, in some cases, the process-induced distortion of the diaphragm portion is divided along the direction into two or more sections, with each section having a distortion different from a distortion of each other section.

For example, any two or more of the adjacent pitches p'_1-p'_i+6 may represent a section of between 3 and 10 fingers, each section having a distortion different from a distortion of each adjacent section. Thus, each section has a counter chirped pitch p'i and mark wi' different than each adjacent section. The process-induced distortion of the diaphragm portion may be $p'_i = (p'^2 - h_i^2)^{1/2}$ for the two or more sections.

The piezoelectric plate has a plate thickness ts (not shown but extending into the page, also see FIG. 2) between the piezoelectric plate front and back surfaces. Thickness ts may be a constant thickness for FIGS. 4A and 4C. Thickness ts may not be a constant thickness for FIGS. 4B and 4D, such as is shown.

During use of XBAR 475, the piezoelectric plate 458 and the IDT are configured such that a radio frequency signal applied to the IDT 465 excites a primary shear acoustic mode in the piezoelectric plate over the cavity. A thickness of the piezoelectric plate or diaphragm can be selected to tune the primary shear acoustic mode in the piezoelectric plate. The XBAR 475 may be used as a shunt or as a series resonator as noted in FIG. 5. Also, the counter chirped IDT concepts herein can be applied to a number of XBARS, such as series and/or shunt XBARS of a filter such as noted in FIG. 5. Each of these the XBARS may have a piezoelectric plate having front and back surfaces, the back surface facing a substrate, portions of the piezoelectric plate forming a plurality of diaphragms spanning respective cavities in an intermediate layer of the substrate.

In an exemplary aspect, counter-chirping may be 'digitized' with an approximate, discrete distribution that best emulates the parasitic chirp being compensated. Generally this will be required since the IDTs do not continuously sample the diaphragm, i.e., they are at discrete locations. In cases where pitch chirping is still desired, the magnitude of the chirp may be augmented to compensate for the 'built-in' chirp: this forms a 'chirp process bias'. A chirp may be desirable to control acoustic spurs, thus a 'chirp process bias' may be applied using counter-chirping to achieve the desired chirping distribution according to an exemplary aspect. Additionally, the counter chirp may be purely dimensional in character, but can be used to address both dimensional and physical property gradients. A spatial variation in acoustic velocity induced by mechanical stress gradients, for example, could be compensated for using a counter-chirp. The optimal counter-chirp for this condition may be derived by empirical measurement or DOE, and may adopt a functional form different from the definition in FIG. 4C.

As noted, membrane deflection of the plate can stretch the IDTs along the width direction or aperture AP direction, such as along section B-B if FIG. 1. In some cases, process-induced distortion of the diaphragm portion of plate 418 or 458 from a mechanical displacement and/or a stress varies along the direction of a length of the fingers, such as in the direction that is tangential to width w' and pitch p'. To the extent this causes a continuous variation in finger thickness along the finger length, the mark wi' may also be counter chirped to mitigate where extreme bowing would otherwise narrow the IDT fingers.

Figure 4F:
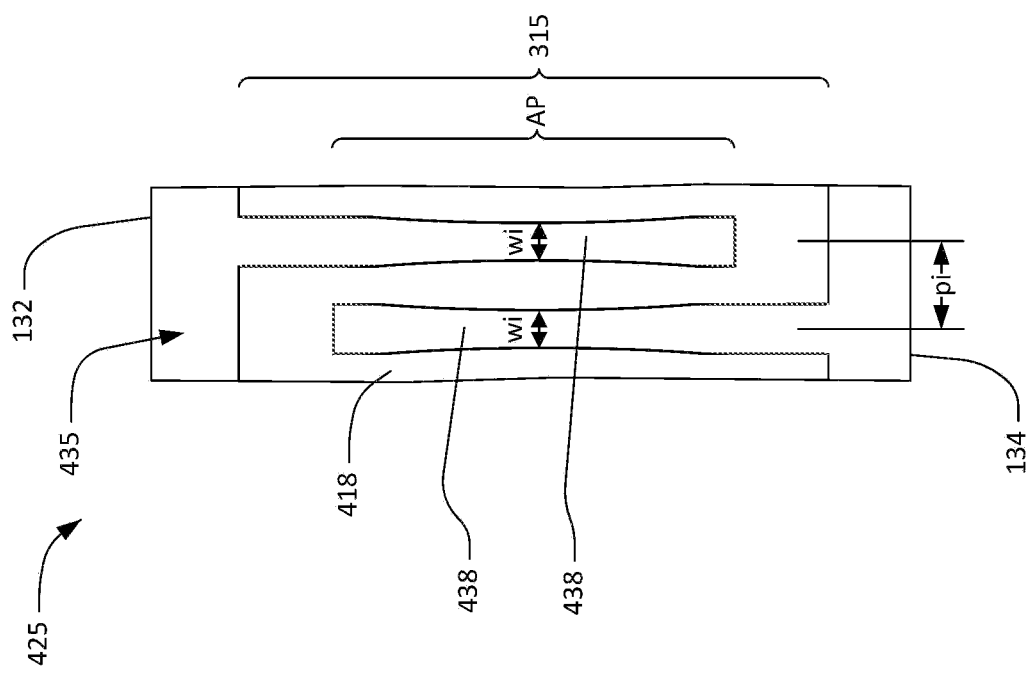
FIGS. 4E and 4F show simplified schematic plan views of XBARS of FIGS. 4A and 4B.
Figure 4E:
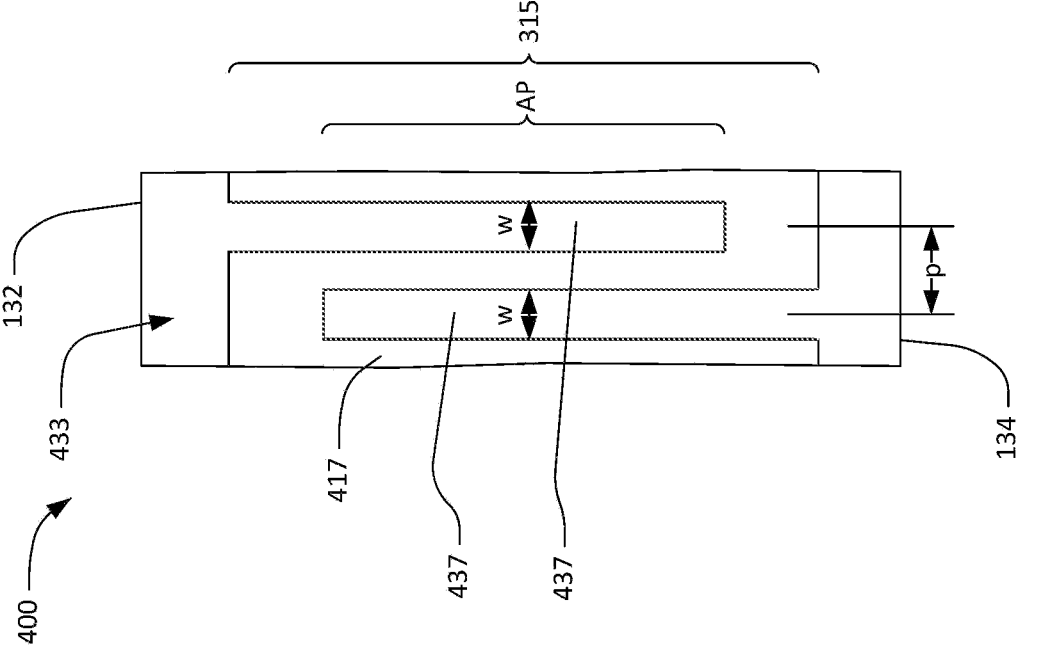
Figure 4H:
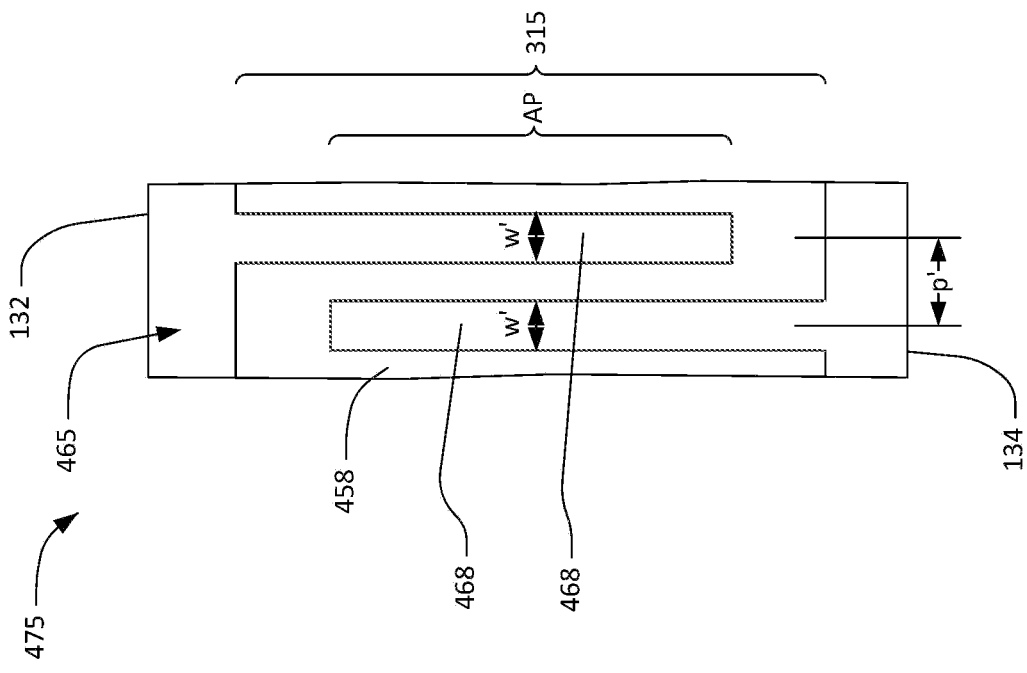
FIGS. 4G and 4H show simplified schematic plan views of XBARS of FIGS. 4C and 4D.
Figure 4G:
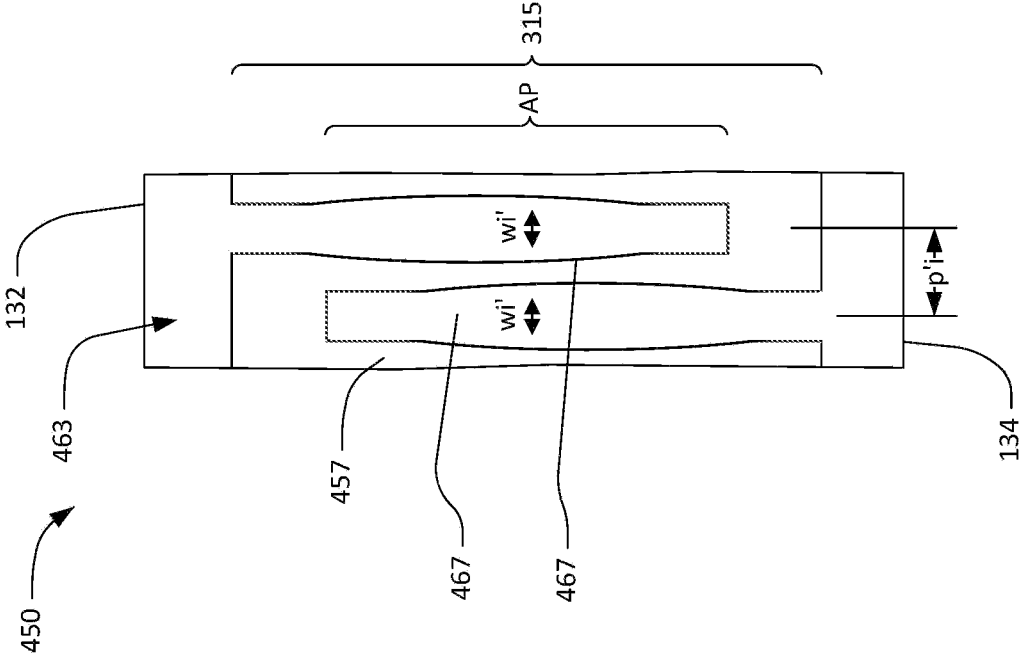

FIGS. 4E and 4F show simplified schematic plan or top perspective views of) XBARS 400 and 425 of FIGS. 4A and 4B. FIGS. 4G and 4H show simplified schematic plan views of XBARS 450 and 475 of FIGS. 4C and 4D. FIGS. 4E-4D show a plan view of a portion of diaphragm having an IDT on or over the piezoelectric plate with respect to FIG. 1 but not the entire width or distanced L of the IDT.

FIG. 4E shows that the fingers 437 of IDT 433 of XBAR 400 have a mark w of the interleaved IDT fingers 437 that does not vary over an area, aperture AP direction or diaphragm 315 of the IDT 433 to compensate for process-induced distortion of the diaphragm portion 315 of the piezoelectric plate 417 with respect to the direction of section B-B of FIG. 1. FIG. 4F shows that the mark wi of fingers 438 of IDT 435 of XBAR 425 are stretched out along the area, aperture AP direction or diaphragm 315 of the IDT 435 due to process-induced distortion of the diaphragm portion 315 of the piezoelectric plate 418 with respect to the direction of section B-B of FIG. 1. If this is not desired, counter chirping can be used to avoid the stretched shape of the fingers.

For example, FIG. 4G shows that the fingers 467 of IDT 463 of XBAR 450 is counter chirped and thicker along to plate 457 along an area, aperture AP direction or diaphragm 315 of the IDT 463. Fingers 467 have a mark wi' that varies over an area, aperture AP direction or diaphragm 315 of the IDT 463 to compensate for process-induced distortion of the diaphragm portion 315 of the piezoelectric plate 457 with respect to the direction of section B-B of FIG. 1. FIG. 4H show that the finger 468 of IDT 465 of XBAR 475 have a mark w' that does not vary over an area, aperture AP direction or diaphragm 315 of the IDT 465 due to process-induced distortion of the diaphragm portion 315 of the piezoelectric plate 458 with respect to the direction of section B-B of FIG. 1. Here, counter chirping, such as noted for FIGS. 4A-4D, can be used to avoid the stretched shape of the fingers of FIG. 4F. Marks wi' of the interleaved IDT fingers 467 vary over an area of the IDT 463 to compensate for process-induced distortion of the diaphragm portion of the piezoelectric plate 457 when it becomes plate 458.

Figure 5:
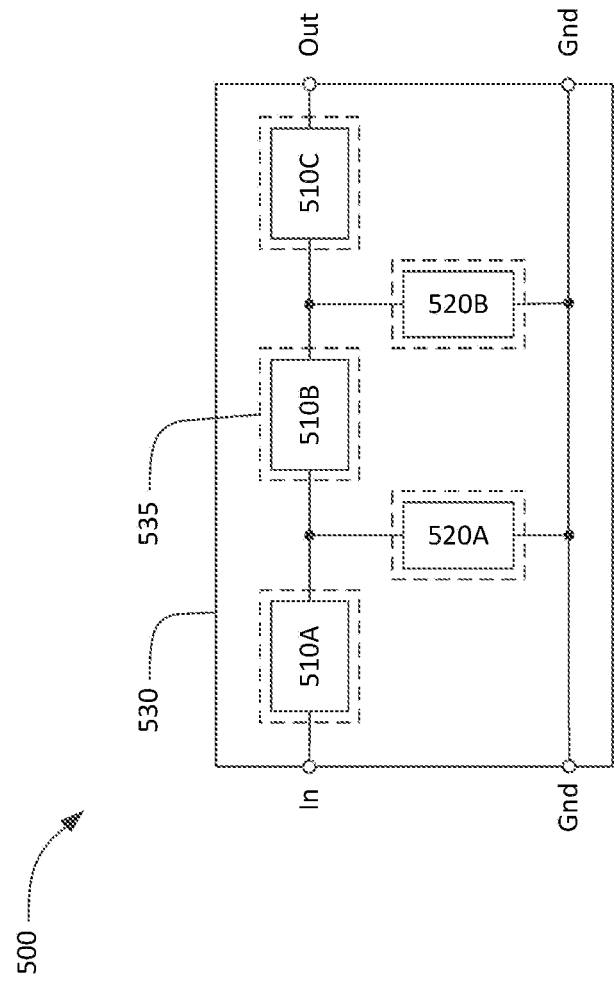
FIG. 5 is a schematic block diagram of a filter using XBARs.

FIG. 5 is a schematic circuit diagram and layout for a high frequency band-pass filter 500 using XBARs where the two connections to an XBAR that are shown are connections to the two busbars of the XBAR. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). Any number of the resonators of filter 500 may be XBAR 425, XBAR 475 or an example of that XBAR. In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

Description of Methods

Figure 6:
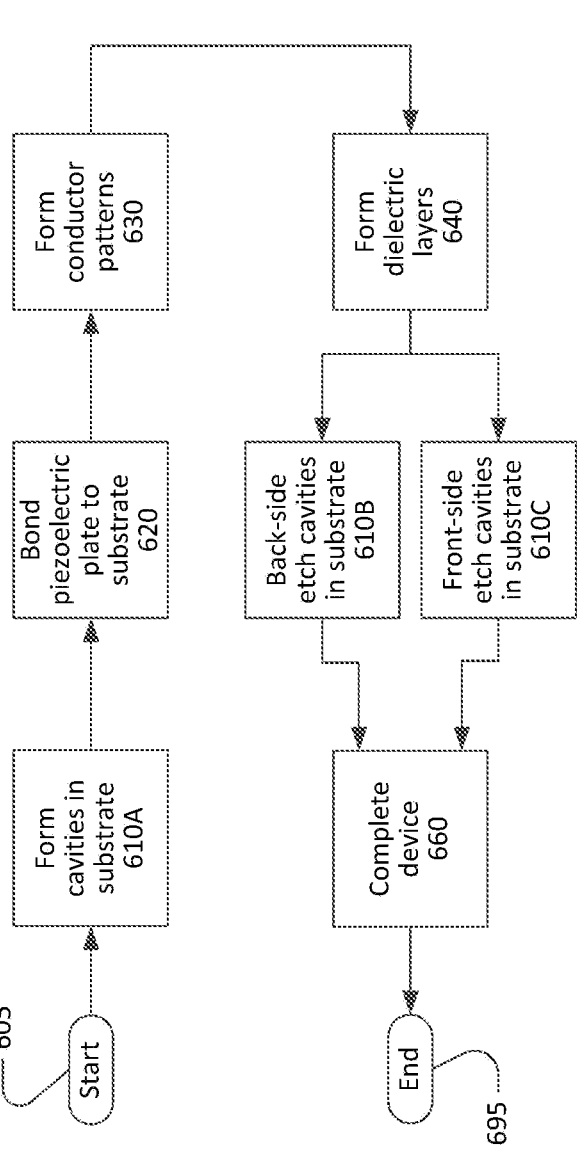
FIG. 6 is a flow chart of a conventional process for fabricating an XBAR.

FIG. 6 is a simplified flow chart showing a process 600 for making an XBAR or a filter incorporating XBARs. The process 600 may form XBAR 400, 425, 450, 457 or an example of that XBAR. The process 600 starts at 605 with a substrate and a plate of piezoelectric material and ends at

695 with a completed XBAR or filter. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. The substrate may be silicon. The substrate or an intermediary layer of the substrate may be some material that allows formation of deep cavities by etching or other processing. The silicon substrate may have layers of silicon TOX and polycrystalline silicon.

In one variation of the process 600, at 610A one or more cavities are formed in the substrate 120 or 320; or an intermediary layer of the substrate, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 322, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

Forming conductor patterns at 630 may include forming the IDT 130 having at least one of a pitch pi of the interleaved IDT fingers or a mark wi of the interleaved IDT fingers vary over the aperture to compensate for process-induced distortion of the diaphragm. Forming at 630 includes counter chirping of device 450 as noted herein. For example, at 630 the pitch pi and the mark wi vary over the diaphragm portion by pre-chirping pitches and marks of pairs of adjacent fingers of the IDT to have different pitches and marks on the plate prior to forming the cavity so that the pairs of adjacent fingers have constant pitches and marks after forming the cavity at 610B or 610C.

The counter chirping, such as at 630, may include selecting the pitch pi of the interleaved IDT fingers and/or a mark wi of the interleaved IDT fingers to compensate for the process-induced distortion of the diaphragm. This selecting may be based compensating for mechanical and/or process-driven spatial variations due to forming the cavity or compensating for temperature variations in the plate after forming the cavity, such as during use of the resonator. This selecting may be based on an empirical measurement, a design of experiments (DOE) or a computer aided design (CAD). The measurement may be of variation dd or hi's of actual or simulated a plate or XBAR without a counter chirped interdigital transducers (IDTs) for mechanical and process compensation, such as that of XBAR 425.

Design of Experiments (DOE) is a systematic method to improve an operating process by analyzing the relationship between the inputs and outcome. Design of experiments (DOE) is a systematic method to determine the relationship between factors affecting a process and the output of that process. In other words, it is used to find cause-and-effect relationships. This information is needed to manage process inputs in order to optimize the output. A designed experiment is a controlled set of tests designed to model and explore the relationship between factors and one or more responses.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate or top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In either variation 610B or 610C, forming a cavity creates the process-induced distortion of the diaphragm and causes a pitch and mark of the IDT fingers to be constant for XBAR 475 because of the counter chirping of device 450. Thus, by pre-chirping pitches and marks of pairs of adjacent fingers of the IDT at 630 to have different pitches and marks on the plate prior to forming the cavity, etching at 610B or 610C causes the pairs of adjacent fingers have constant pitches p and marks w after forming the cavity at 610B or 610C.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-4 may show examples of the fingers of selected IDTs after completion at 660.

Forming the cavities at 610A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 610B requires additional handling inherent in two-sided wafer processing. Forming the cavities from the back side also greatly complicates packaging the XBAR devices since both the front side and the back side of the device must be sealed by the package.

Forming the cavities by etching from the front side at 610C does not require two-sided wafer processing and has the advantage that the XBAR diaphragms are supported during all of the preceding process steps. However, an etching process capable of forming the cavities through openings in the piezoelectric plate will necessarily be isotropic. However, as illustrated in FIG. 3A, such an etching process using a sacrificial material allows for a controlled etching of the cavity, both laterally (i.e. parallel to the surface of the substrate) as well as normal to the surface of the substrate.

Figure 7:
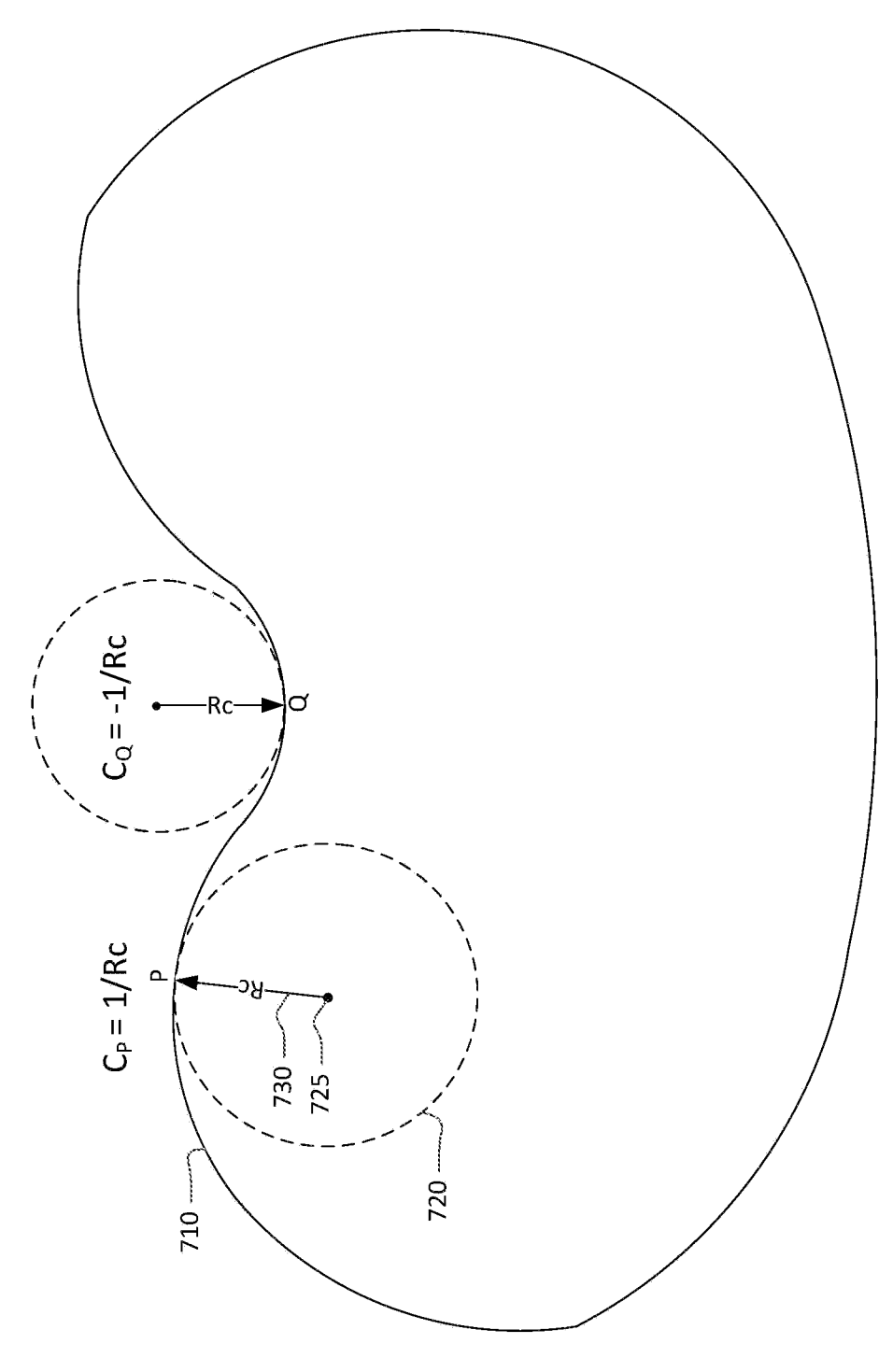
FIG. 7 is a graphic that illustrates the definition of the curvature of a line or a curved shape.

FIG. 7 is a graphic that illustrates the definition of the curvature of a line or a curved shape. The line 710 is a two-dimensional closed curved line having an arbitrary shape. The circle 720 is the so-called "osculating circle", which is the circle that best approximates the curve 710 at a point P. More precisely, given a point P on the curve 710, every other point X (not shown) of the curve 710 defines a circle (or sometimes a line) passing through X and tangent to the curve at P. The osculating circle is the limit, if it exists, of this circle when X closely approaches P. Radial line 730 joins point P to the center 725 of the osculating circle 720. The length Rc of the radial line 730 is the "radius of curvature" of the curve 710 at the point P. The curvature $C_P$ at the point P is the reciprocal of Rc. The curvature at a point on the perimeter of a cavity is positive if the radial line joining the point and the center of the corresponding osculating circle is within or crosses the cavity. Conversely, the curvature at a point on the perimeter of a cavity is negative if the radial line joining the point and the center of the corresponding osculating circle is outside of the cavity. For example, the curvature of the line 710 at point Q is negative.

Since the radius of curvature of a straight line is infinite, the curvature of a straight line is zero. Conversely, since the radius of a sharp corner (for example a corner formed by the intersection of two lines) is zero, the curvature of such a corner is infinite.

In this patent, the perimeter of a cavity is "curved" if the curvature for at least one point on the perimeter is non-zero and finite. The perimeter 145 of the cavity 140 in FIG. 1 is not curved. The curvature of the perimeter 145 is zero along the straight top, bottom, left, and right (as seen in the figure) sides of the cavity and infinite in the corners where the sides intersect. At no point on the perimeter 145 is the curvature both non-zero and finite. This will be true of any perimeter having only straight sides.

The perimeter of a cavity is "continuously curved" if the curvature is non-zero and finite at every point along the perimeter. The perimeter of a cavity is "corner-less" if the curvature is finite at all points along the perimeter.

A portion of the perimeter having positive curvature is "convex", and a portion of the perimeter having negative curvature is "concave". The perimeter of a cavity is continuously convex if the curvature at every point on the perimeter is finite and greater than zero. The perimeter of the cavity is "non-concave" if the curvature at every point on the perimeter is finite and greater than or equal to zero.

An "elliptical" shape is curved, corner-less, continuously curved, and non-concave as those terms were previously defined.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator, comprising:

a piezoelectric layer having first and second surfaces that oppose each other, the second surface facing a substrate, the piezoelectric layer including a diaphragm that is over a cavity; and a conductor pattern on at least one of the first and second surfaces, the conductor pattern comprising an interdigital transducer (IDT) having interleaved fingers on the diaphragm of the piezoelectric layer, wherein at least one of a pitch of the interleaved fingers or a mark of the interleaved fingers varies over an area of the IDT, wherein the pitch is a center-to-center spacing between adjacent fingers of the interleaved fingers of the IDT, and the mark is a width of at least one finger of the interleaved fingers of the IDT, and wherein the at least one of the pitch or the mark of the interleaved fingers of the IDT varies according to $p'_i=(p'^2-h_i^2)^{1/2}$, where i is an integer representing the pitch between the adjacent fingers or the mark of the at least one finger, p'i is a counter pitch or mark variation for the at least one finger, p' is a length along a direction of a distortion of the at least one finger, and h is a height of the distortion of the at least one finger.

2. The acoustic resonator of claim 1, wherein:

the piezoelectric layer and the IDT are configured such that a radio frequency signal applied to the IDT excites a primary shear acoustic mode in the diaphragm, such that a direction of acoustic energy flow excited in the diaphragm is substantially orthogonal to the first and second surfaces of the piezoelectric layer, and the pitch and the mark of the interleaved fingers vary over the diaphragm to compensate for bowing of the diaphragm due to process stress or temperature changes during use.

3. The acoustic resonator of claim 1, wherein:

an overlapping distance of the interleaved fingers defines an aperture of the acoustic resonator, and at any point along a length of the IDT, the at least one of the pitch or the mark of the IDT varies across the aperture of the IDT.

4. The acoustic resonator of claim 3, wherein the at least one of the pitch or the mark varies across all of the interleaved fingers of the IDT.

5. The acoustic resonator of claim 1, wherein the at least one of a pitch of the interleaved fingers and the mark of the interleaved fingers varies in a direction tangential to a length of the interleaved fingers.

6. The acoustic resonator of claim 5, wherein the at least one of the pitch of the interleaved fingers or the mark of the interleaved fingers varies to compensate for a distortion of the diaphragm, which is due to one of a mechanical displacement or a stress that varies along the direction tangential to the length of the interleaved fingers of the IDT.

7. The acoustic resonator of claim 6, wherein the distortion of the diaphragm is divided along a length of the diaphragm into two or more sections, with each section having a distortion different from a distortion of each other section.

8. The acoustic resonator of claim 7, wherein the distortion of the diaphragm is $p'_i=(p'^2-h_i^2)^{1/2}$, for the two or more sections.

9. A filter device, comprising:

a piezoelectric layer having first and second surfaces that oppose each other, the second surface facing a substrate, portions of the piezoelectric layer forming a plurality of diaphragms that are over respective cavities in an intermediate layer of the substrate;

a conductor pattern on at least one of the first and second surfaces, the conductor pattern comprising a plurality of interdigital transducers (IDTs) that each have interleaved fingers on a respective diaphragm of the plurality of diaphragms, wherein at least one of a pitch or a mark of the interleaved fingers of each IDT varies over the respective diaphragm, wherein the pitch is a center-to-center spacing between adjacent fingers of the interleaved fingers of at least one IDT of the plurality of IDTs, and the mark is a width of at least one finger of the interleaved fingers of the at least one IDT, and wherein the at least one of the pitch or the mark of the interleaved fingers of the IDT varies according to $p'_i=(p'^2-h_i^2)^{1/2}$, where i is an integer representing the pitch between the adjacent fingers or the mark of the at least one finger, $p'_i$ is a counter pitch or mark variation for the at least one finger, p' is a length along a direction of a distortion of the at least one finger, and h is a height of the distortion of the at least one finger.

10. The filter device of claim 9, wherein the piezoelectric layer and the plurality of IDTs are configured such that a respective radio frequency signal applied to each IDT excites a primary shear acoustic mode in the respective diaphragm of the plurality of diaphragms, such that a direction of acoustic energy flow excited in the diaphragm is substantially orthogonal to the first and second surfaces of the piezoelectric layer.

11. The filter device of claim 9, wherein:

the piezoelectric layer and each of the plurality of IDTs are configured such that a radio frequency signal applied to each IDT of the plurality of IDTs excites a primary shear acoustic mode in the respective diaphragm, and the pitch and the mark vary over the respective diaphragm to compensate for bowing of the diaphragm due to process stress or temperature changes during use.

12. The filter device of claim 9, wherein:

an overlapping distance of the interleaved fingers of each IDT of the plurality of IDTs defines an aperture of the respective IDT, and at any point along a length of the IDT, the at least one of the pitch or the mark of the IDT varies across the aperture of the IDT.

* * * * *